(12) United States Patent
Nishijima et al.

(10) Patent No.: US 12,202,740 B2
(45) Date of Patent: Jan. 21, 2025

(54) CONTAINER ASSEMBLY

(71) Applicant: Brita LP, Oakland, CA (US)

(72) Inventors: Rick T. Nishijima, Pleasanton, CA (US); Elizabeth Bransford, Pleasanton, CA (US)

(73) Assignee: Brita, LP, Oakland, CA (US)

( * ) Notice: Subject to any disclaimer, the term of this patent is extended or adjusted under 35 U.S.C. 154(b) by 323 days.

(21) Appl. No.: 17/684,704

(22) Filed: Mar. 2, 2022

(65) Prior Publication Data
US 2023/0278889 A1  Sep. 7, 2023

(51) Int. Cl.
*C02F 1/00* (2023.01)
*G01F 1/86* (2006.01)
*G01R 33/07* (2006.01)

(52) U.S. Cl.
CPC ................. *C02F 1/003* (2013.01); *G01F 1/86* (2013.01); *G01R 33/07* (2013.01); *C02F 2209/40* (2013.01); *C02F 2209/445* (2013.01); *C02F 2307/04* (2013.01)

(58) Field of Classification Search
CPC ............................. C02F 1/003; C02F 2209/40; C02F 2209/445; C02F 2307/04; G01F 1/86; G01F 15/0755; G01F 15/125; G01F 3/28; G01F 3/32; G01R 33/07; G01R 33/072; G01R 33/091
See application file for complete search history.

(56) References Cited

U.S. PATENT DOCUMENTS

| | | | |
|---|---|---|---|
| 4,344,331 A * | 8/1982 | Iwasaki | G01F 1/28 324/207.16 |
| 7,905,144 B2 | 3/2011 | Thobe | |
| 8,171,802 B2 | 5/2012 | Henderson et al. | |
| 9,505,633 B2 * | 11/2016 | Bari | C02F 1/003 |
| 2003/0067378 A1 * | 4/2003 | Baarman | B01D 46/0086 337/241 |
| 2005/0035036 A1 * | 2/2005 | Moretto | C02F 1/003 210/474 |
| 2011/0240475 A1 * | 10/2011 | Hother | G01F 23/241 204/674 |

FOREIGN PATENT DOCUMENTS

EP    2952481 A1    12/2015

* cited by examiner

*Primary Examiner* — Terry K Cecil
(74) *Attorney, Agent, or Firm* — Harness IP

(57) ABSTRACT

A container assembly is disclosed. The container assembly includes a container that contains a volume. Selected portions of the container assembly may provide indication to a user of features or status of the container assembly, including portions thereof.

24 Claims, 11 Drawing Sheets

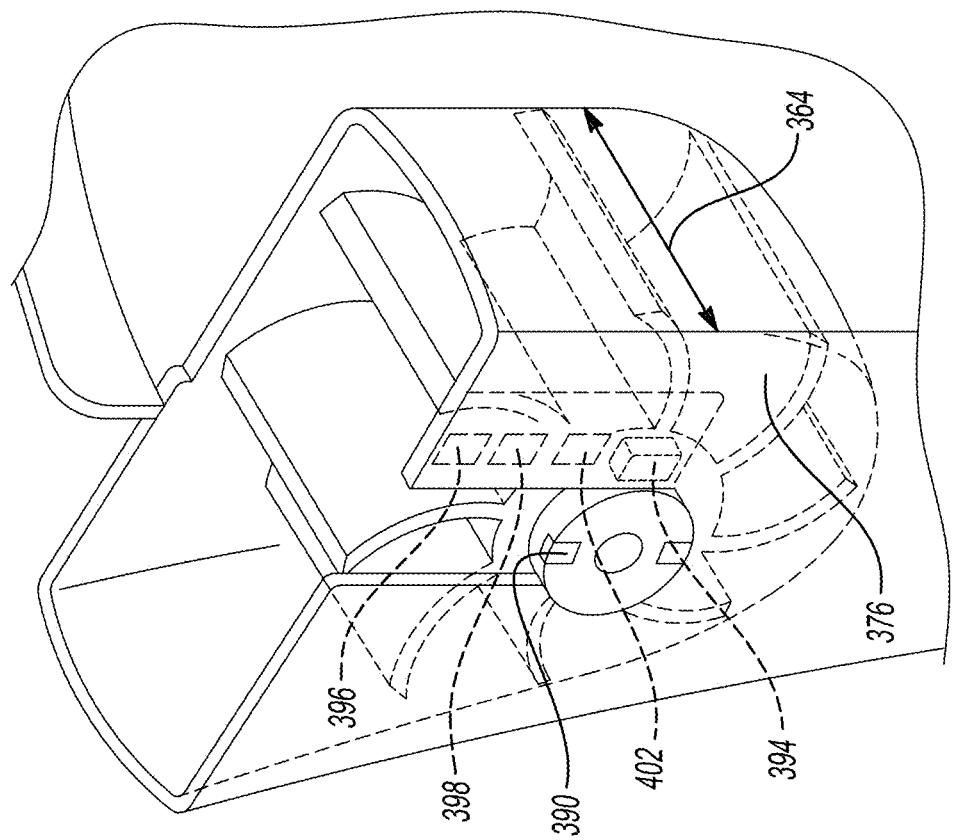
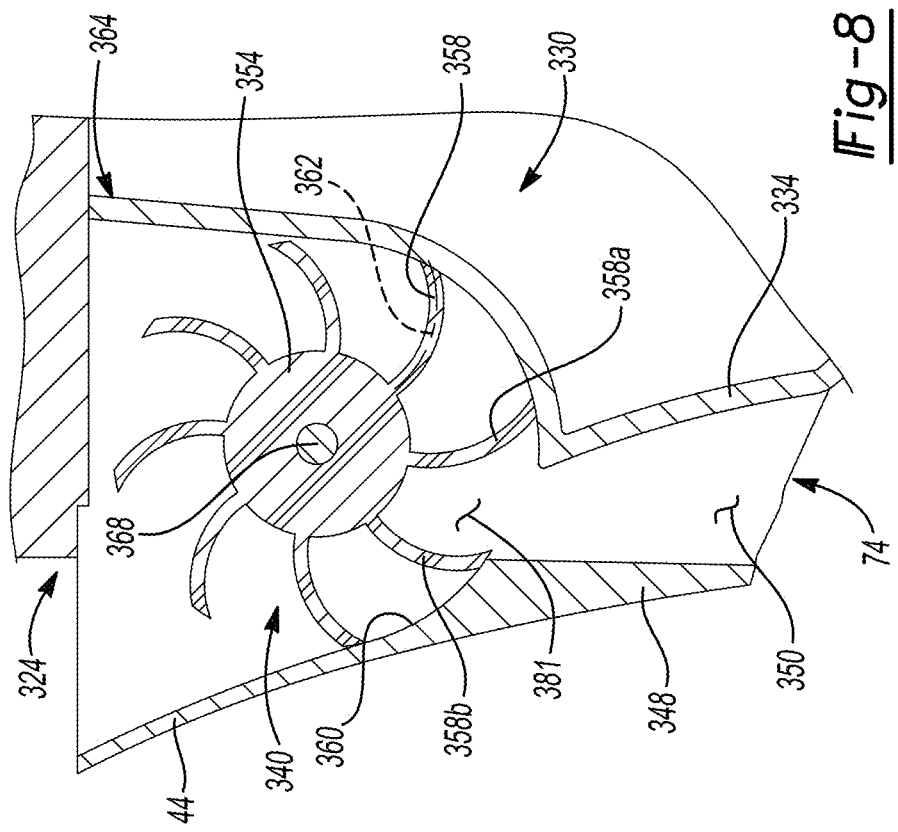

CONTAINER ASSEMBLY

FIELD

The subject disclosure relates to a container, and particularly to a container including an indicator system.

BACKGROUND

This section provides background information related to the present disclosure which is not necessarily prior art.

A container may hold a volume of a fluid, such as liquid water, for a selected period of time. The container may be filled and emptied through selected ports of the container. The container may further include a removable lid to access and interior of the container.

SUMMARY

This section provides a general summary of the disclosure, and is not a comprehensive disclosure of its full scope or all of its features.

A container may be formed of a selected material, such as a food suitable polymer, metal, and/or glass. The container may include a plurality of walls, such as walls to form side walls extending from a base to define an interior volume. The walls may also be formed at generally non-orthogonal angles relative to one another and/or curved relative to one another. Additionally, the container may include removable features, such as a lid or filling cover, to allow for ease of access to fill the container. In various embodiments, the container may include a bottom or lower wall from which side walls extend. The bottom wall may be positioned on a surface and/or have legs or protrusions extending therefrom to contact a surface. Also, the container may be filled and emptied by a user, as discussed herein.

In various embodiments, the container may include a single reservoir. The single reservoir may be filled and emptied, as selected by a user. In various embodiments, the container assembly may include two reservoirs, such as a first reservoir and a second reservoir. The first reservoir may be a pre-filter reservoir and the second reservoir may be a post-filter reservoir. The container may further include at least one removable lid portion for filling a selected reservoir, such as the single reservoir and/or the pre-filter reservoir. A top lid or wall may also be provided through which the selected reservoir may be filled.

The container system may include a filter assembly. The filter assembly may have a selected or preferred filter capacity or life timespan which may be monitored. Monitoring the filter capacity may assist in ensuring optimal or selected filtering during use of the container assembly.

An indicator may be provided with the container assembly for indicating the selected or preferred filter capacity or life timespan and/or remaining portion thereof of the filter assembly. The indicator may include a light indicator that displays a selected color based upon a current or projected lifespan of the filter assembly. In various embodiments, a light emitting portion (e.g., light emitting diode (LED), incandescent bulb, etc.) may be provided that indicates or displays a selected color when using the container, such as filling the container, pouring a material from the container, or other selected uses of the container. The indicator may also or alternatively include a visual or auditory display.

Further areas of applicability will become apparent from the description provided herein. The description and specific examples in this summary are intended for purposes of illustration only and are not intended to limit the scope of the present disclosure.

DRAWINGS

The drawings described herein are for illustrative purposes only of selected embodiments and not all possible implementations, and are not intended to limit the scope of the present disclosure.

FIG. 8 is detailed cross-sectional view of a sensor assembly, according to various embodiments;

FIG. 9 is a detailed view of the sensor assembly of FIG. 8, according to various embodiments;

Corresponding reference numerals indicate corresponding parts throughout the several views of the drawings.

DETAILED DESCRIPTION

Figure 1A:
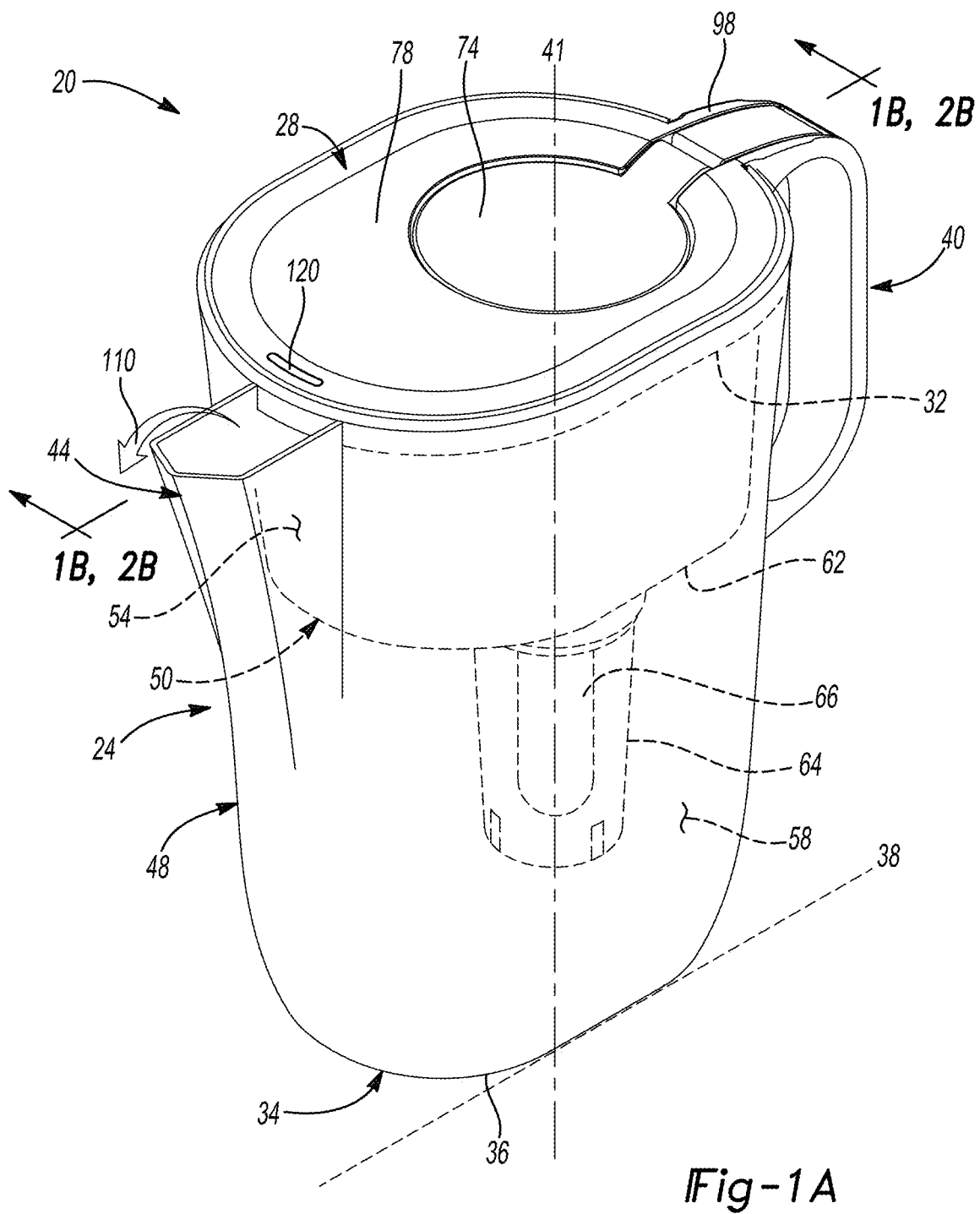
FIG. 1A is a perspective view of a container assembly, according to various embodiments.

Example embodiments will now be described more fully with reference to the accompanying drawings.

With reference to FIG. 1, a container assembly 20 is illustrated. The container assembly 20 may include various components, such as a container 24 and a top lid assembly 28. The container may be an appropriate container that includes the lid assembly 28. Container 24 may include containers such as those included with the Monterey pitcher, the Soho pitcher, Grand pitcher, and other appropriate pitchers sold by Brita®, LP. Container 24 may also or alternatively include containers disclosed in U.S. Pat. Nos. 7,905,144 and 8,171,802 and U.S. Pat. App. Pub. No. 2011/0240475, all incorporated herein by reference.

The lid assembly 28 may cover a top or open portion of the container 24 such as being mounted or connected to a top edge or portion 32 of the container 24. The container 24 may extend from the top or first end 32 to a base, bottom wall, or second end 34 that may define a surface 36, which may be a base surface that supports the container assembly 20 on a selected surface or portion 38. The container 24, in various embodiments, may extend along or generally along an axis 41. The axis 41 is understood to be perpendicular to the surface 38. As discussed herein, the container 24 may move or be operated relative to the surface or axes 38, 41. Various sensors may operate to determine a position of the container 24 relative to either or both.

The container assembly 20 may include various components to assist in use of the container assembly 20, such as a handle or graspable portion 40 and a pour spout 44. The container 24 may include one or more sidewalls 48. The sidewalls 48 may be provided in an appropriate or selected shape, such as defining an oval or cylinder that extends from the base or bottom wall 34. The handle 40 may extend from the sidewall 48 opposite the spout 44. Further, the container 24 may be divided into one or more regions such as by a reservoir or internal reservoir assembly 50. The reservoir 50 may divide the container 24 into a first or pre-filter volume 54 and a second or post-filter volume 58. The reservoir assembly 50 may include an internal structure, as discussed herein, which is positioned within the container 24. The reservoir 50 may further include a base or bottom wall 62 that may define a filter reservoir or holding portion 64. In various embodiments, therefore, a filter 66 may be positioned in the filter holder 64. The container 24 may then be filled in the reservoir volume 54 and the material may drain through the filter assembly 64 into the holding volume 58.

The container assembly 20 may also or alternatively, according to various embodiments, include a single reservoir volume. With reference to FIG. 2, for example, a container assembly 20' is illustrated. The container assembly 20' may include a single volume 70. The single volume 70 may be filled through the lid assembly 28, such as through a fill portal 74. The fill portal 74 may be opened relative to a lid top 28. Additionally, the entire lid assembly 28 may be removed, as discussed further herein. Regardless, a filter area or subassembly 82 may be formed with and/or connected to the lid assembly 28. The fill portal 74 may be opened and a liquid may be filled into the volume 70 and pass through a filter member 84 that is suspended by a filter shelf or holding portion 88. Formed through the filter shelf 88 may be one or more ports 92. Accordingly, the liquid may enter through the portal 74, pass through the filter assembly 84, and be held within the volume 70.

Additionally or alternatively, a liquid, such as water, may be filled with the volume 70 through the lid or opening 32 in the container 24' and/or the fill portal 74 even with the filter assembly 82 not present. Positioned adjacent to the pour spout 44 may be a filter assembly 96. The filter assembly 96 may include a filter holding portion 98 and a filter member 102. The filter holding portion 98 may have one or more ports 106 that allow a fluid to pass into the filter holding portion 98 and through the filter 102 before exiting the spout 44, as discussed further herein. Accordingly, the container 24' may be filled with a selected fluid that is either filtered when held within the reservoirs 58, 70 and/or filtered as it exits the reservoirs 58, 70. Regardless, the container assemblies 20, 20' may be used to filter a selected material, such as a liquid including water, and an indication of a select parameter regarding the filter members 66, 84, 102 may be provided to a user, such as with a user signal, as discussed further herein.

Returning reference to FIGS. 1A, 2A and 2B the container assembly 20 having an internal volume 58 may further include a flow sensing assembly 130. The flow sensing assembly 130 may include a housing or bracket component 132 that may be fit or fixed to the reservoir 50. The measuring assembly 130, including the housing 132, however, may be fixed directly to the container 24. For example, the housing 132 may be fixed to an inner surface 134 of the wall 48 of the container 24. The sensor assembly 130, according to various embodiments, therefore, may be fixed relative to the spout 44 to measure a flow of a material, such as a fluid, generally in the direction of arrow 110a (from the volume 58) as the fluid or material may pass out of the spout 44. The spout 44 may be one outlet or the only outer and the flow may generally be in the direction of arrow 110.

Figure 2A:
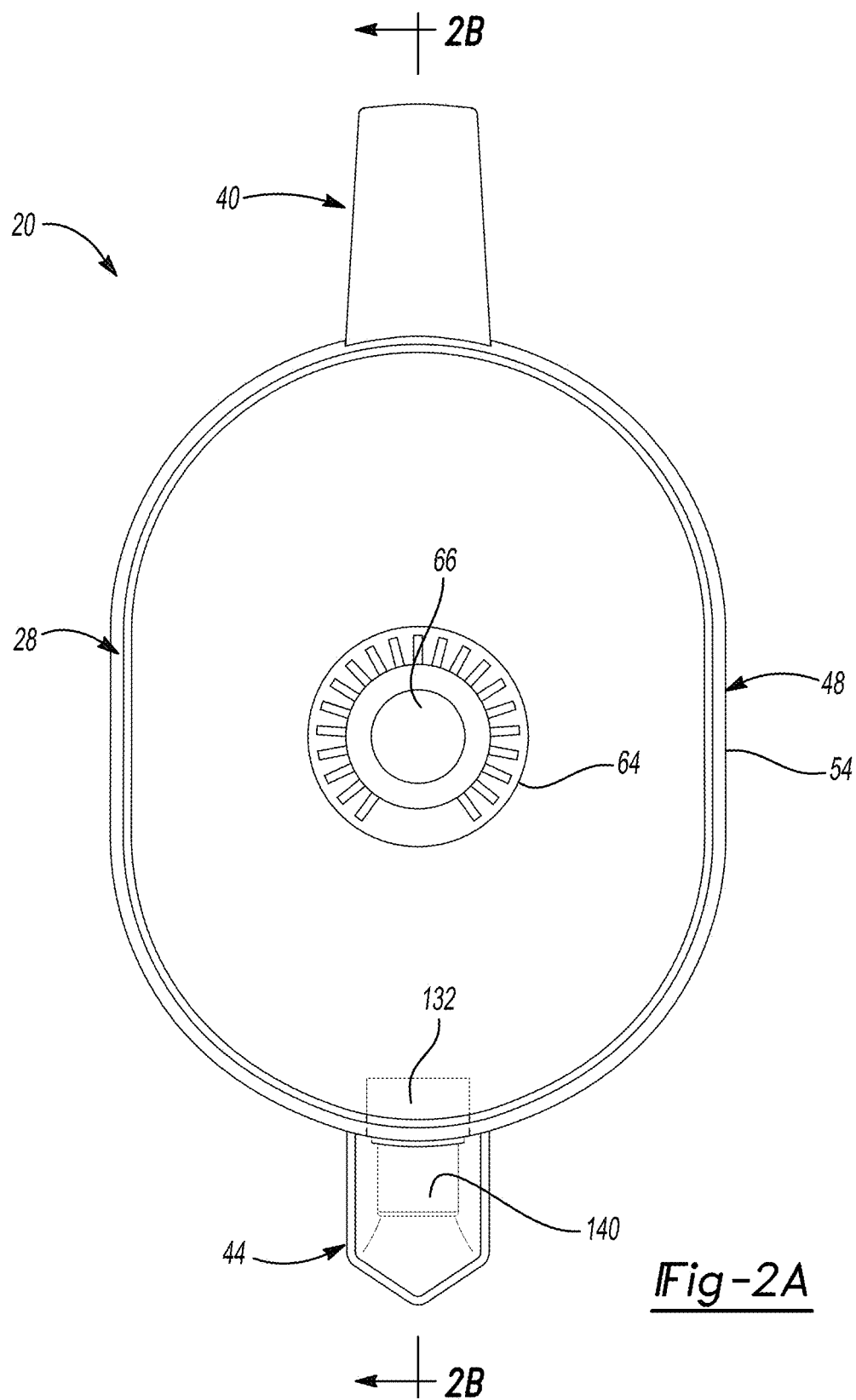
FIG. 2A is a top perspective open view of the container assembly of FIG. 1.
Figure 2B:
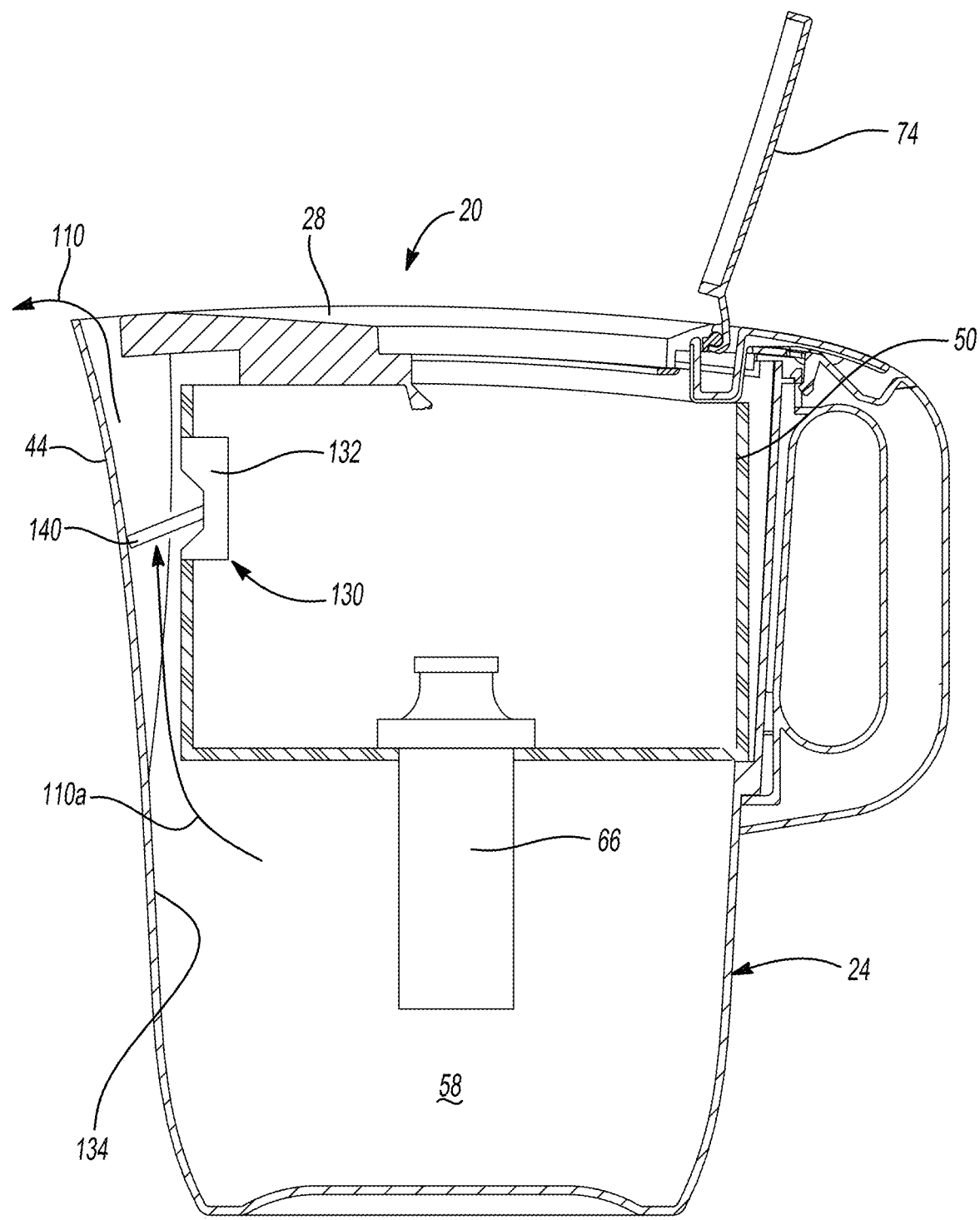
FIG. 2B is a cross-sectional view of the container assembly of FIG. 2A along line 2b-2b.
Figure 4:
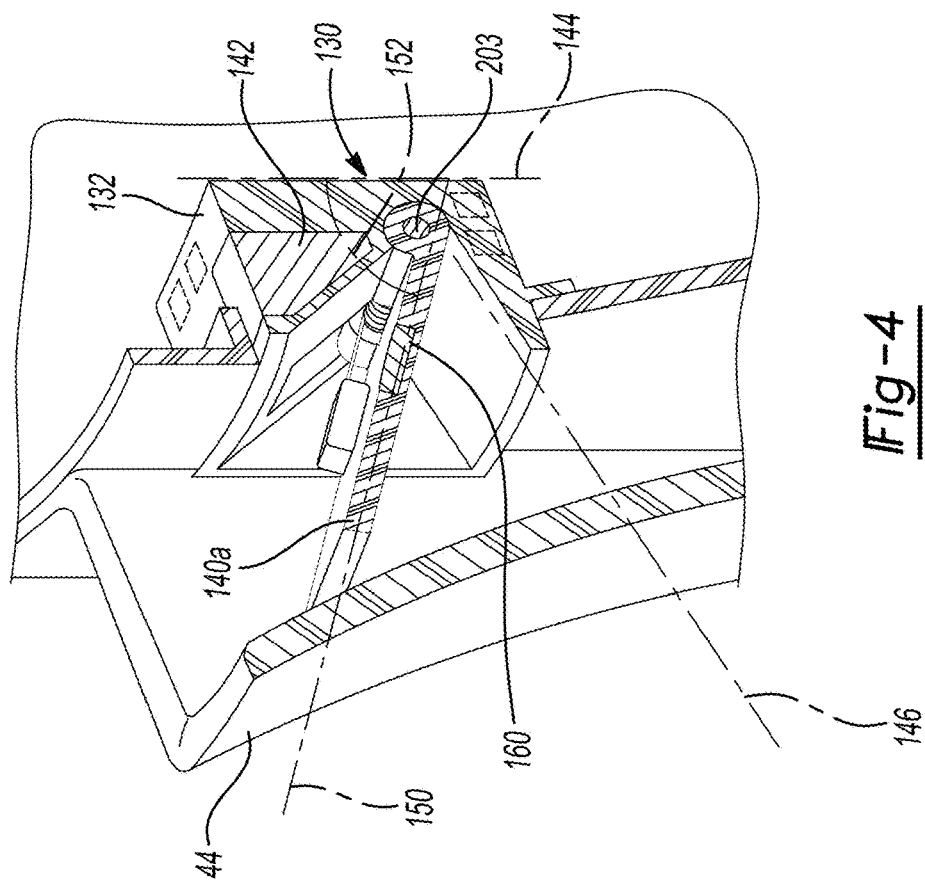
FIG. 4 is a detailed view of a sensor assembly in a selected configuration, according to various embodiments.
Figure 3:
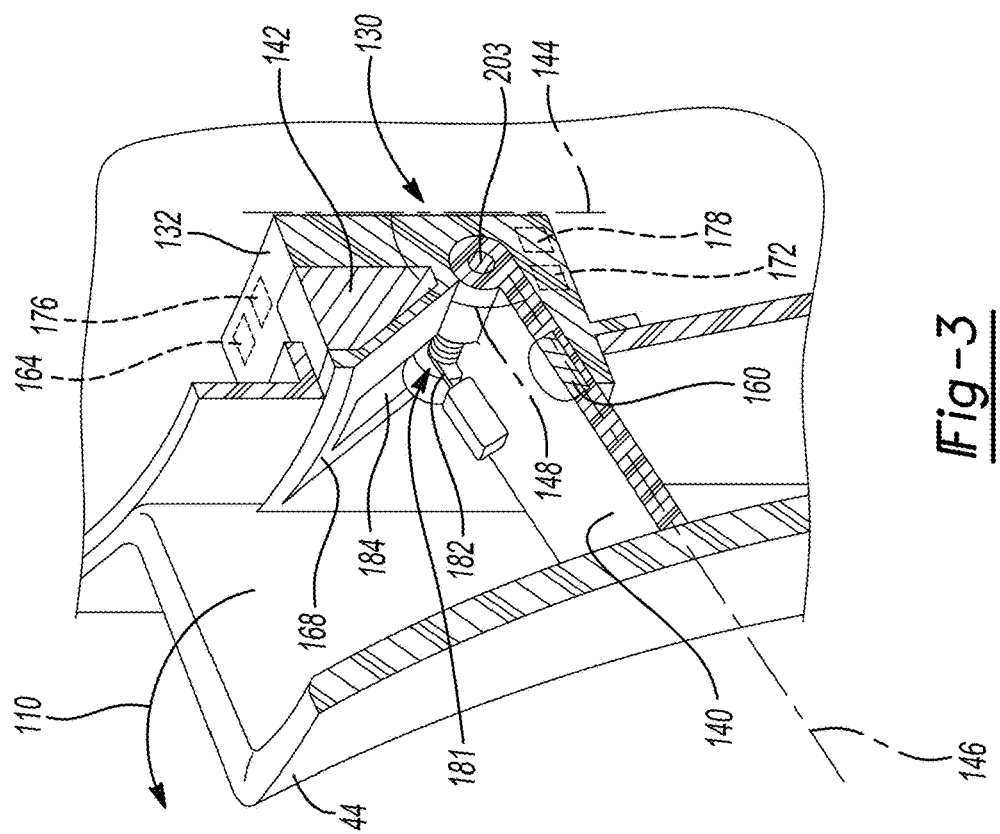
FIG. 3 is a detailed view of a sensor assembly in a selected configuration, according to various embodiments.

With continuing reference to FIGS. 2A and 2B and additional reference to FIG. 3, the sensor assembly 130 will be described in greater detail. Generally, the sensor assembly 130 may be used to measure a flow rate of fluid as it flows out or exits the container 24, such as generally in the direction of arrow 110. The sensor assembly 130 may include a door or actuation member 140. The door member 140 may move relative to a sensor member 142. The door member 140 and the sensor member or portion 142 may both be held relative to the housing 132. Generally, the sensor member 140 may be held fixed relative to the container, such as the lid 28 of the container, while the door member 140 may move relative to the sensor 142 and other portions of the container assembly 20, such as the lid 28. As discussed further herein, the door member 140 may be positioned at a first or resting position as illustrated in FIG. 3. At a selected time, however, the door 140 may move to one or more open positions, for example at least one open position 140a, as illustrated in FIG. 4. The sensor assembly 130 may be able to sense the position of the door 140 relative to the sensing member 142 or relative to the axis 41 to determine a position of the door 140 relative to the opening.

Generally, the housing member 132 may define a selected geometry, such as an outer wall surface axis 144. The door 140 may have a resting position at a first axis or position 146. The first position along the axis 146 may have a first angle 148 relative to the axis 144. At the second position of the door 140a, the door may extend along a second axis or position plane 150, 152 relative to the axis or position 144. In various embodiments, the axis 144 of the housing 132 may extend substantially parallel of the axis 41 of the container 24. It is understood, however, that the housing axis 144 may be positioned at any appropriate position relative to the spout 44 and, as discussed further herein, the determined movement or position of the door 140 relative to a portion of the housing 132 may be determined. The sensor member 142 may be used to determine the position of the door 140 for various purposes, as discussed herein, such as to determine a flow rate of material past the door.

Figure 1B:
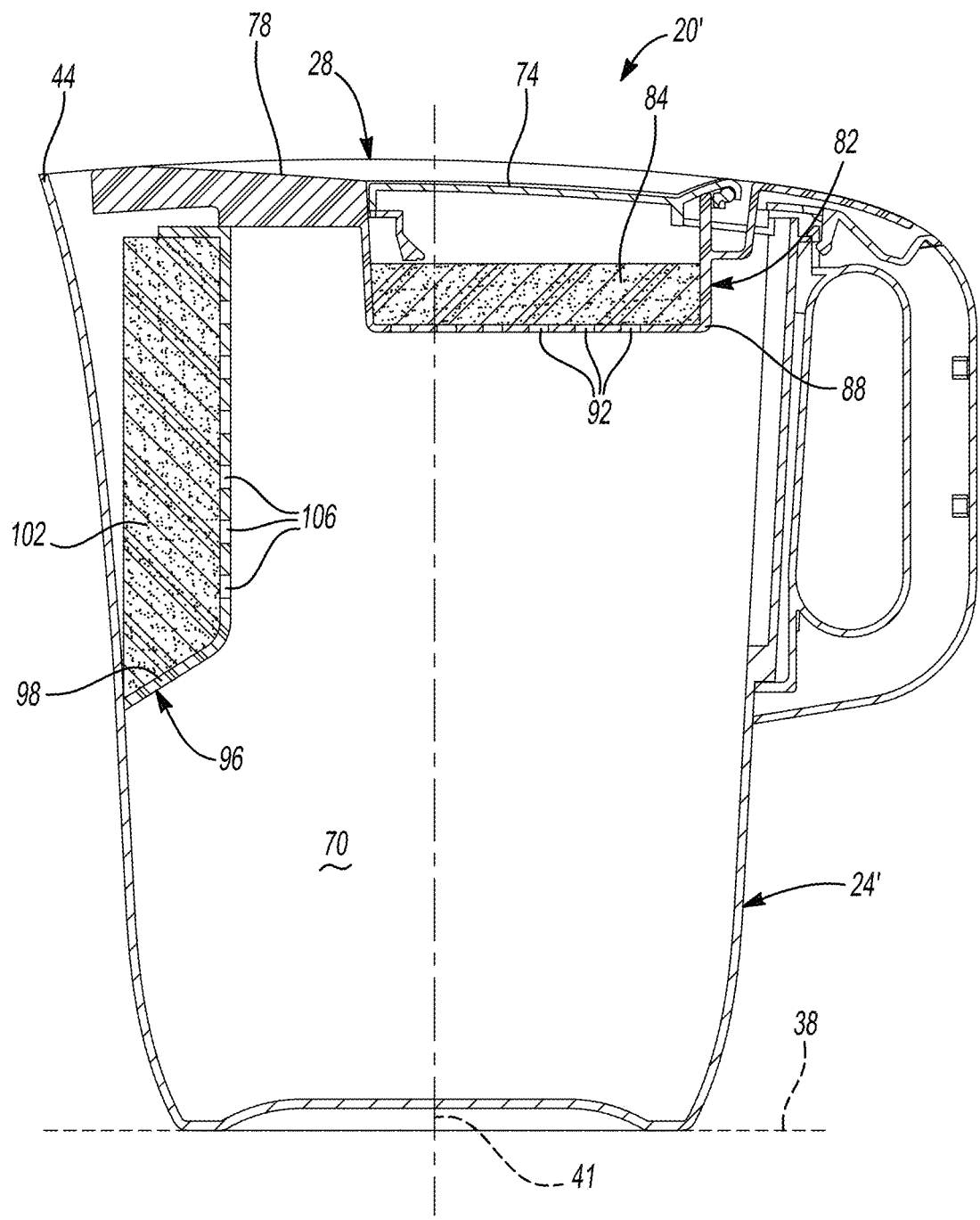
FIG. 1B is a cross-sectional view of a container assembly, according to various embodiments taken along line 1b-1b of FIG. 1A.

The container assembly 20, 20' in various embodiments, may include the openable or fill lid portion 74 that may be opened to allow material to enter the container 24, 24'. The fill lid 74 may be moveable relative to the top lid assembly 28, such as the lid wall 78. The fill lid 74, therefore, may be moveable between a closed position as illustrated in FIGS. 1A and 1B an open position as illustrated in FIG. 2.

Liquid placed in the container 24, including in the prefilter volume 54, may include water which may filter through the filter 66 positioned in the filter holder 64. The water may pass through the filter 66 in the filter holder 64 to the post-filter volume 58. Thus, the container 24 may hold for a selected period of time the filtered water in the holding or post-filtered volume 58. At a selected time, a user may dispense a selected volume of the liquid from the post filter volume 58 through the spout 44. In various embodiments, the user may grasp the handle 40 and tilt the container 24 to cause a portion of the fluid to pass through the spout 44 generally in the direction of an arrow 110. The liquid may be dispensed through the spout 44 from the post-filter volume 58 for use by the user, or an appropriate individual.

In various embodiments, the container assembly 20 may be used to assist for monitoring one or more filters in the container assembly 20, 20'. The filter may be any of the filters 66, 84, 102 or any other appropriate filter member. The filter member may generally be preferred or selected to filter a selected volume of a fluid, such as water, or in use for a selected period of time. Thus, an indicator 120 may be used to identify to a user the past time or amount of use or remaining time or amount of use of the filter. For example, a number or percentage of remaining filter life in volume and/or time. In a further example, the indicator 120 may indicate a filtered amount (e.g. volume), a remaining filter amount, a remaining life span or time, or other measurements. The indicator 120, therefore, may be provided to indicate various features and statuses of the container assembly 20.

As discussed further herein, however, the indicator 120 provides an indication of a status of a filter positioned in the container assembly 20. The indicator 120 may include various features such as a visible light emission that may be viewable by a user, such as a human. The indicator 120 may also include various pulsing rates, light intensities, colors, and other light features to assist in providing different statuses of the filter. In various embodiments, the indicator 120 may include a length, and the indicator may be a light emitted in a changing pattern along a length or portions of the indicator 120, thereby mimicking movement. Thus, the indicator 120 may provide an indication of a status of the filter such as an efficacy of the filter, a lifespan of the filter, or other appropriate features. The indicator 120 may also or alternatively include a graphical or numerical display to display discrete information to the user.

With continuing reference to FIG. 3 and FIG. 4, the door 140 may be moved as material flows from the container 24. In various embodiments, for example, the material may flow from the single reservoir within the container 24 and/or a selected reservoir within the container 24. Regardless, material may flow from the reservoir toward and through the spout 44 generally in the direction of arrow 110. As the material flows in the direction of arrow 110, the door 140 may be moved from the resting position, as illustrated in FIG. 3, to one or more open positions as illustrated in FIG. 4. In various embodiments, only the force of the material (e.g. fluid including water) moving in the direction of arrow 110 causes the door 140 to move. Thus, gravity or air pressure will not move the door 140.

The position of the door 140 relative to the selected portion of the housing 132, such as the axis 144, may be based on the volume of material, such as the fluid, passing or flowing through the spout or out the spout 44 generally in the direction of arrow 110. The sensor 142 may be an appropriate proximity sensors. The sensor 142, for example, may include at least one of a Hall effect sensor, a magnetoresistive sensor, or other appropriate electromagnetic sensor. The exemplary discussion of a magnetoresistive sensor herein is not intended to limit the sensor so a specific sensor, unless specifically stated. Generally, the sensor 142 may sense a magnetic field emitted by a sensor member or portion 160 that may be positioned (e.g., fixed to and/or within) relative to the door 140. In various embodiments, the sensor 142 may be a magnetic sensor that measures a magnitude of a magnetic field (such as from the sensor member 160) and has at its output a voltage that is directly proportional to the magnetic field strength through it. As the sensor member, which may also be referred to as a magnet or magnetic member 160, moves relative to the sensor 142 (such as a magnetoresistive sensor), a magnetic field and/or change in magnetic field strength may be sensed by the sensor 142. The strength of sensed magnetic field by the sensor 142 may be used to determine a position of the door 140 within the spout 44, such as an axial position relative to the axis or surface 144.

In various embodiments, the sensor assembly 130 may include a controller 164 that may also be referred to as and/or include a processor system or module that may receive a signal form the sensor portion 142 based upon the position or the proximity of the magnet 160. The processor module 164 may be integral with the sensor portion 142 and/or separate therefrom such as included with the sensor assembly 130. As discussed further herein, the processor 164 may determine, such as by executing selected instructions, the position of the door 140 within the spout 44. The position of the door 140 may be used to determine a flow rate (i.e., volume per unit of time) through the spout 44, such as the direction of the arrow 110.

The door 140 may move to various positions relative to the sensor assembly 142. For example, as illustrated in FIG. 3, the sensor door may be in a rest position and extend along the plane or line 146 to be at the angle 148 relative to the line or surface 144. As illustrated in FIG. 4, the door 140 may move and be at position 140a and extend along the line 150 to be at the angle 152 relative to the surface or plane 144. At either the position, the sensor 142 may sense or not sense the magnetic field of the magnet 160. The magnetic field strength sensed by the sensor 142 at either position, however, may be different. Based upon the sensed magnetic field the processor assembly 164 of the sensor assembly 130 may be used to determine an absolute or relative position of the door 140 as discussed further herein.

It is understood that the door 140 may be moved to a plurality of positions from the rest position 146 to a fully open position, such as when the door 140 engages an open position surface 168 of the sensor housing 130 and/or portion of the container 24. Each position may be measured in an infinite number of positions and/or at selected increments between the rest position 146 and the fully open position in contacting the surface 168. Accordingly, the illustration of the two positions in FIG. 3 and FIG. 4 are merely exemplary and not intended to limit the scope of the subject application.

The door 140 may be moved to various positions relative to the sensor 132, as discussed above. The processor module 164 may identify the position of the door 140 and determine a flow rate when the door 140 is at the known position. A flow rate may, therefore, be predetermined and stored for one or more positions of the door 140. For example, four positions of the door may be predetermined and a flow rate for each may be calculated and/or measured. Thus, a flow rate may be predetermined for each known or measureable position of the door 140. The flow rate may, as is understood by one skilled in the art, vary depending of various parameters such as cross-sectional area of the flow area, force on the flowing material, etc.

The time at the position may then be summed to determine a total volume per pour, such as between when the door moves from the rest position as illustrated in FIG. 3 to any open position and back to a rest position. Over time, these summations may also be summed to determine a total volume for a selected period, such as for a single filter member. A process for such determinations is discussed further herein.

In various embodiments, with reference to Table 1 shown below, the door 140 may be determined at one of a predetermined number of positions for determining a flow rate and/or flow volume. The flow rate may be for water (e.g., pure water, standard municipal supply water, and/or etc.) at standard conditions, such as temperature, air pressure, etc. The rate may exemplarily be measured as milliliters (ml) per millisecond (ms) (ml/ms).

TABLE 1

| Open Percentage | Flow Rate (ml/ms) | Voltage |
|---|---|---|
| 0 | 0.00 | 0 |
| 10 | 0.01 | 1.6 |
| 25 | 0.02 | 2.0 |
| 50 | 0.04 | 2.3 |
| 75 | 0.06 | 2.6 |
| 100 | 0.08 | 2.9 |

In Table 1 the door may be at selected positions such as 0% open, 10% open, 25% open, 50% open, 75% open, or 100% open. The door may be 100% open when the door 140 contacts or substantially contacting or adjacent to the surface 168 of the sensor housing 132. The door may be at 0% open when the door is at the rest position at the planar line 146. The other positions may be calibrated or determined between these two positions in any appropriate manner, such as during the manufacturing of the sensor assembly 130. It is understood that more or fewer positions may be determined and relative flow rates. For example, only 0, 25, 50, 75, and 100% open may be determined. Generally, the door 140 may move between an obstructed position (i.e., 0% open) and an open or flowing position (i.e., greater than 0% open).

As noted above, the flow rate may be predetermined, as noted in Table 1. The flow rates that are predetermined, however, may vary based on an opening size (e.g., cross-sectional area of a flow path), door size, force of the material, viscosity of the material, etc. Thus, the predetermine flow rates, door positions or open amounts (e.g., open percentages) may vary, but may be predetermined based on known and/or measured parameters of the system.

The sensor 142 may generate a voltage based upon a position of the magnet 160. As discussed above, the sensor 142 may be a magnetoresistive sensor which generates a voltage based upon a sensed magnetic field. A magnetoresistive sensor that operates according to such an operation includes a magnetoresistive sensor LIS3MDLTR Digital output magnetic sensor produced and sold by STMicroelectronics. Accordingly, as illustrated in Table 1 each position of the door may relate to a sensed magnetic field that generates a selected voltage. That being that the 0% door open position generate 0 volts, a 10% door open position generate 1.6 volts, a 25% door open position generate 2.0 volts, a 50% door open position generate 2.3 volts, a 75% door open position generate 2.6 volts, and a 100% door open position generate 2.9 volts. The generated volts may be based upon a construction of the system and may be altered based upon the specific sensor 142, strength of the magnet 160, a power source 172, or other appropriate portions of the sensor assembly 130. Accordingly, the voltages are exemplary and may be calibrated based upon the predetermined or selected opening percentages of the door 140.

With reference to Table 1, each of the positions of the door may also be related to a specific flow rate. The flow rate may be any appropriate or selected flow rate may be determined in milliliters per millisecond (mL/ms) for calculation purposes. For example, the processor module 164 may operate at a selected frequency, such as about 100 Hz. Accordingly, a calculation or a count taken every ms or at each increment of 1 ms may be selected. Each of the open percentages may relate to a determined mL per ms flow rate. For example, the zero door open position may be a zero flow rate, 10% door open position may be a 0.01 ml/ms flow rate, 25% door open position may be a 0.02 ml/ms flow rate, a 50% door open position a 0.04 ml/ms flow rate, a 75% door open position a 0.06 ml/ms flow rate, and a 100% door open position a 0.08 ms/ml flow rate. As one skilled in the art will understand, the flow rates in milliliters per second may be determined by multiplying the number by 1,000 such that a 0.01 milliliters per millisecond is equal to 10 milliliters per second. Further, it is understood that the flow rate may be determined in a calibration and/or manufacturing step of the container assembly 20. For example, the flowrate can be determined during calibration during manufacturing by moving (e.g., lifting) the door and correlating the door angles to corresponding voltage outputs. This may be used to develop a calibration curve to output a flowrate at any angle of the door. This could be used to measure at discrete points (e.g., five points) to develop ranges of angles that correspond each to one flowrate. The more ranges with corresponding flowrates the more refined a calibration curve can be created.

As illustrated in Table 1, the door may be determined to be opened to different percentages that may be calibrated to various voltages. Each of the percent openings may relate to a specific flow rate. It is understood that the percent openings, flow rates, and voltages may all be altered based upon the size of the door 140, the size of the spout 44, the specific sensor assembly of the sensor assembly 130, or other features. Nevertheless, it may be predetermined for various selected positions of the door, such as three, four, five, 10 or different number of positions of the door.

To determine a volume, the flow rate may then be summed, as discussed further herein. It is further understood that the various flow rates, voltages, and percent openings may include a selected variability. For example, each of the flow rates may be plus or minus 10%, the voltages may be plus or minus 5-15%, the percentage openings may include thresholds. Accordingly, the door may be determined to be 50% when the voltage is determined to be 2.23 volts. The door 140 may be determined to be 50% open at any voltage range between 2.3 and 2.6 and once the voltage reaches 2.6 the door may be determined to be 75% open. The percent of door openings may be threshold, for example as illustrated in Table 1. It is understood, however, that the position of the door may include a determination of more discrete openings, such as with a distance measurement, and a flow rate may relate to more than the five positions as illustrated in Table 1. Having five positions, however, may be used to reduce memory required for the look-up table 1 that may be accessed by the processor module 164, an efficient or simple algorithm for determining full volume and total volume determination, or other appropriate purposes.

The sensor assembly 130 may further include a memory module 176. The memory module 176 may be integral with the processor module 164 and/or separate therefrom. The memory module 176 may contain the Table 1 as a look-up table and/or instructions for determining an instantaneous flow rate, summing for determining an accumulated volume, or other appropriate instructions. Further, the memory module 176 may store a selected number of determined volumes. For example, prior volumes and/or an updated volume to determine a total used volume. Further, the memory module 176 may include instructions for providing an indication of the user of the use of the container assembly 20.

The container assembly 20 may include sensors in addition to the sensor 142 and/or the sensor assembly 130. Additional sensors may include an accelerometer 178. The accelerometer 178 may be included in the sensor module 130 and/or at any other appropriate positions, such as within the lid 28, the handle 40, or other appropriate location. Regardless, the accelerometer 178 may determine a movement of the container 24 and/or a position of the container 24 relative to gravity. For example, the accelerometer 178 may be used to determine an angle or movement of the container 24 such as relative to the axis 41 and/or the surface 38. The accelerometer 178 may detect movement and/or angle to determine that the container 24 may be used for pouring fluid and/or is in a pour position. The requirement of a pour position in combination with movement of the tilting door could be used to prevent readings from occurring from movements in the flap during transportation of the pitcher. Additionally, the angle of the pitcher during a pour may correlate to the amount of water in the pitcher. The amount of water in a pitcher during a pour affects the flowrate at different tilting angles. In one example, therefore, the pour angle can be calibrated at a selected number of points (e.g., four points) using the accelerometer output and the flowrate measured at a fixed tilting door angles and the various pour angles to determine the change in flowrate based on the pour angle. The flowrate may then be estimated by referencing the tilting angle of the door and the pour angle of the pitcher for a selected, including additional, accuracy. Further, in various embodiments, the accelerometer 178 may be used to provide a wake signal to wake the sensor 142. Therefore, the sensor 142 may be in a sleep mode except when awakened by the signal from the accelerometer 178. Other appropriate sensors may be used to determine an angle or position of the container 24 and also provide and/or alternatively provide a wake signal to the sensor 142. Accordingly, the accelerometer is merely exemplary of an additional sensor to determine a position of the container 24 and/or provide a wake signal to the sensor 142.

With continuing reference to FIG. 3 and FIG. 4, the door 140 may be held in the closed or occluding position, such as near adjacent the angle 146, with a selected biasing member, 181. The biasing member 181 may include a first arm 182 that directly engages the door 140 and a second arm 184 that engages the housing 132 of the sensor assembly 130 or other appropriate portion. In various embodiments, the biasing member 181 may be a torsion spring. The torsion spring may have a selected spring force that holds the door 140 in the closed position 146 according to the selected force. The spring force may be selected such that the door 140 is held in the rest position 146 against its own mass when acted upon only by gravity, but will move when contacted by or engaged by the fluid within the container 24. For example, if the container 24 is empty the spring 181 may hold the door 146 in the closed position even when the container 24 is moved relative to the axis 41. When fluid, such as water, however, is directed along the spout 44 the additional mass and/or force of the water will overcome the force of the spring 181 to move the door 140 to an open position, including the open positions discussed above. Accordingly, the biasing member 181 may be used to ensure that the door 140 does not move to an open position with its own mass, but requires an additional force, such as force of the water, to overcome the force of the spring 181 to move the door 140 to an open position. In other words, the biasing member 181 may be used to ensure that the door 140 does not move to an open position and cause an erroneous determination of a passage of fluid. The biasing member 181, either alone or in combination with the door 140, may ensure that only the force and/or passage of the fluid to the spout 44 causes the door 140 to open. The biasing member 181 may include a selected spring force to achieve a selected measurement and/or flow rate determination.

Figure 5:
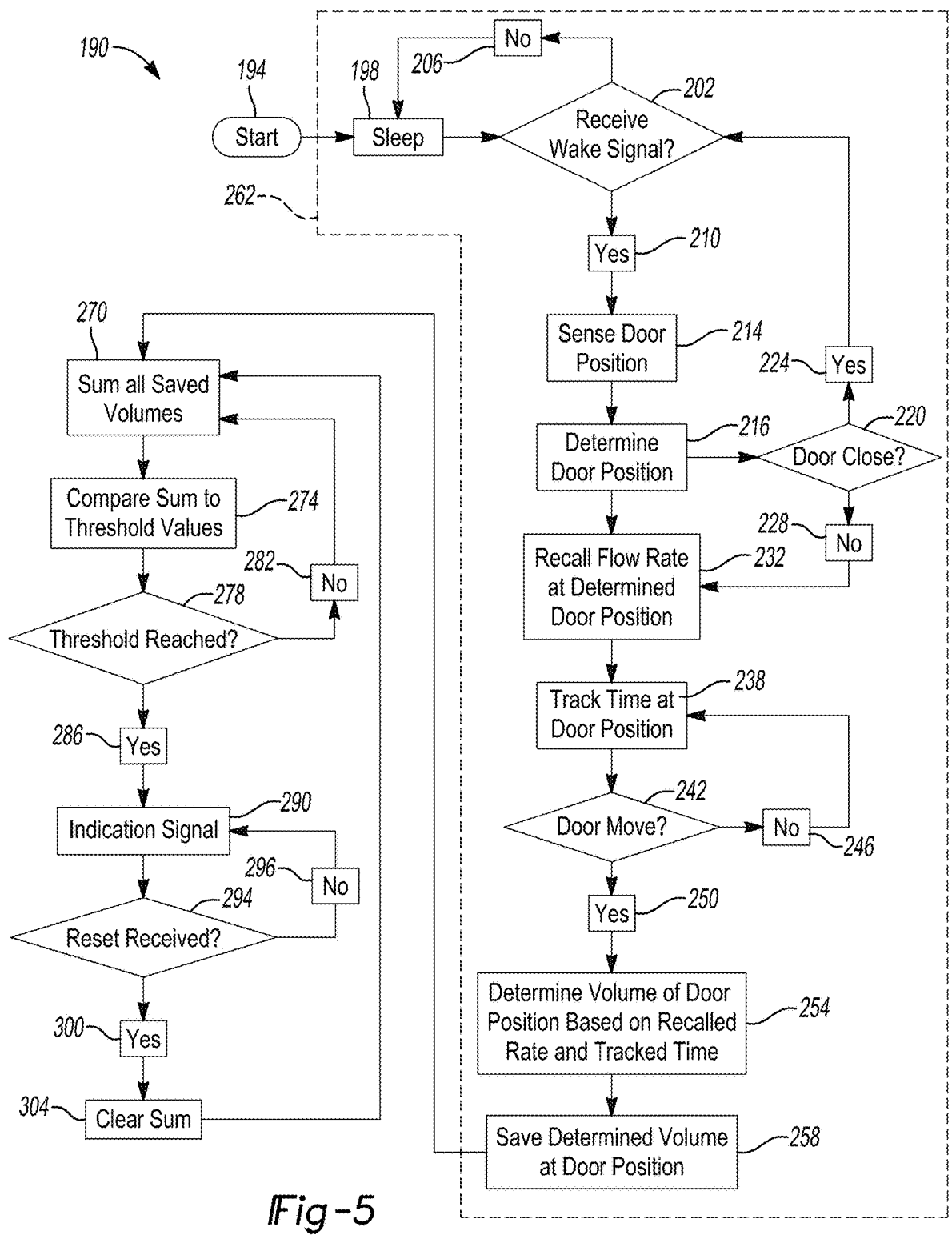
FIG. 5 is a chart of a method for calculating a volume.

The sensor assembly 130 may operate to measure a flow rate and/or determine a volume according to a process 190 as illustrated in FIG. 5. Initially the method 190 may begin at a start block 194. The start block 194 may include various processes such as these initializing the system during assembly, inserting a battery, removing a tab to power the system, or the like. For example, during an initial assembly a protective cover may be placed to disconnect the power source 172. A user, such as a consumer, may remove a tab to initialize the sensor assembly 130. Accordingly, the start block 194 may include assembly of the container assembly 20, removal of the protective device, or any other appropriate portion.

After the start in block 194, the sensor assembly 130, including at least the position sensor 142, may go into a sleep mode in block 198. The sleep mode 198 may be a low power and/or off mode such that the sensor 142 does not draw power from the power source 172 when in not use. The process may then move to determining whether a wake signal is received in block 202. The wake signal may be based upon a signal from the accelerometer 178, as discussed above, a tilt sensor, a pressure switch actuated by the user, or any appropriate signal. The wake signal may indicate that the sensor 142 may be powered on with the power source 172 in an appropriate manner. Accordingly, if no wake signal is received in block 202, a NO path 206 may be followed to maintain the sleep mode. If a wake signal is received, a YES path 210 may be followed. The signal may be provided to the sensor 142 in any appropriate manner such as with an integrated circuit board, interconnectors, or the like.

At the wake signal, the sensor assembly 130 may power on and the sensor 142 may sense position of the door in block 214. Sensing the position of the door in block 214 may include sensing a magnetic field generated by the magnet 160, as discussed above. Accordingly, the sensor 142 may generate a voltage based upon the position of the magnet 160, as discussed above and illustrated in Table 1. A determination of the door position may be made in block 216 based upon the sensed position in block 214. The determination of the door position in block 216 may be made by the processor 164 executing selected instructions, as discussed above. In various embodiments, as discussed above, the processor module 164 may access a look up table to determine a position of the door based on a sensed or transmitted voltage. It is also understood that a direct calculation of the position of the door may be made based upon a voltage sensed by the sensor 142. In various embodiments, the door 142 may also be turn on an axle 203 which may include or have positioned relative thereto potentiometers, a light counter or sensor, or other appropriate sensor to determine the position of the door 140. Accordingly, the determination of the position of the door 140 in block 216 may include a look up table as noted above, but may also include other determination methods.

After determining a position of the door 140, a determination of whether the door is closed in block 220 may be made. If the door is closed, a YES path 224 may be followed to determine whether a wake signal has been received in block 202. In other words, although a wake signal may be determined, if the position of the door is determined to be closed the system may attempt to reenter a sleep mode if no wake signal is received and/or received for a selected period of time. For example, a wake signal may cause the sensor 142 to remain awake for a selected period of time, such as 1 second, 5 seconds, 10 seconds, 30 seconds, or any appropriate period of time. After a selected period of time, if no input is received from the position sensor or a determination that the door is closed in block 220 the system may reenter the sleep mode.

If a determination that the door is closed is no, a NO path 228 may be followed. After following the NO path 228, a recall of a flow rate or flow rate at a determined door position n is made in block 232. As noted above, the position of the door may be related to a selected or predetermined flow rate that may be recalled from the Table 1. Accordingly, once the position of the door 140 is determined in block 216, a recall flow rate at the determined position may be made in block 232. Based upon a flow rate or with the flow rate, a time may be tracked of the door at the determined position in block 238. For example, as noted above, the processor module 164 may operate at a selected frequency. Accordingly, the processor 164 may count the time or cycles at the door position determined in block 216 and at the flow rate recalled in block 232.

At a selected time, such as upon receiving a signal regarding a new position of the door, after selected periods of time, etc., the process 190 may make a determination of whether the door has moved in block 242. If the door has not moved in block 242, a NO path 246 may be followed to continue tracking time at the door position n in block 238. The time at the door position n may, therefore, continue to be counter and then summed.

If a determination is made, however, that the door has moved, a YES path 250 may be followed. After determining that the door has moved from position n, the system, such as the processor 164, by executing selecting instructions, may determine a volume that has flowed through the door at the door position n based on a recalled rate and tracked time in block 232, 238, respectively. Accordingly, once the door has moved or been determined to be moved from the first or "n" sensed position in block 214, a determination of the volume at that position may be made. The determination may be a calculation of the recalled rate multiplied by the tracked time in block 238. Other appropriate calculations may also be made, however, the determination of the volume at the specific position may be made in block 254. The determined volume at position "n" in block 254 may then be saved in block 258. Saving the volume at the door position 258 may be storing the volume to the memory module 176, as discussed above. The stored volume may be stored for selected purposes, as discussed further herein.

After determining the volume from the pour and/or simultaneously when determining the volume, a sensed position of the door at block 214 may again be determined. Accordingly, once the door has been determined to move to block 242 the sensed position of the door may again be made in block 214. Thereafter, a determination of whether the door is closed or whether the door is in a new or different position may be made, as discussed above. The system may again return to the sleep mode in block 198 or recall the flow rate in block 232 and tracked time at the position in block 238. Thus, a determination of a volume at a new or different door position may be made in block 254 and again saved in block 258.

The process 190 may determine a pour instance or occurrence and make a volume determination for the instance in a process or subroutine 262, as discussed above. That is once the system is awakened, a determination of a volume during the awaken instance may be made and saved as discussed above. During a single pour occurrence the position of the door may be at several different positions, thus requiring several different calculations of volume which all may be saved 258. The sub-process 262 may loop until the system determines that the sleep state should be reentered and the volumes are saved in block 258.

The saved determined volumes in block 258 may then be further processed such as with the processor module 164. That being a determination of whether an indication, via an indication signal, is or should made to a user, via a user indication signal, regarding the filter. The process may include summing all saved volumes in block 270. Summing all saved volumes in block 270 may allow for a determination of a cumulative use which may also be referred to as a "lifetime" use of a various portions of the assembly 20, such as the filter 66. After summing all of the saved volumes in block 270, a comparison to a threshold value may be made in block 274. The threshold value may be based upon time and/or volume that may be determined with the sub-process 262. After comparing the sum to a threshold of value in block 274, a determination of whether a threshold value has been reached is made in block 278. If a threshold value has not been reached, a NO path 282 may be followed to continue to sum the values in block 270. The summing of the values in block 270 may occur at any appropriate time, such as at selected intervals, after each process of the subroutine 262, or at any appropriate time. Nevertheless, the summing of the values may be done to determine a total use including a plurality of pour cycles based upon saved determined volume from block 258.

If the threshold value has been reached in block 286, an indication signal may be made in block 290. The indication signal may be for providing a user signal to a user in an appropriate manner. As discussed above, the indication signal may cause a user signal such as with a screen including a user interface, an LCD display, a light emitting portion, or the like may be used to indicate whether a threshold value has been reached. The indication signal may be generated by the processor module 164 and transmitted to any appropriate portion for generating the user signal.

After the indication signal in 290, a determination of whether a reset signal in is received block 294 may be made. Resetting the system may include removing the filter 66 and replacing it with a new filter 66 including a switch in the filter well or holding area of the container assembly 20. Further, a reset signal may be received by or generated by the user with a push button, switch, or the like. If a reset signal has not been received, a NO path in block 296 may be followed to continue the signal generation block 290. If a signal reset has been made or determined in block 294, a YES path 300 may be followed to a clear sum block 304. After clearing the sum block 304, the process may then loop back to sum all saved values, which may be initialized or initiated at a zero sum after clearing the sums in block 304.

Therefore, the method 190 may include a first subroutine to generate a volume per pour cycle or occurrence, which may include a wake portion before the system resets to a sleep mode. The saved volumes may then be summed over a plurality of pour cycles and/or an extensive pour cycle to determine whether the user signal should be generated that the threshold value has been reached. The threshold value may include a total volume that has been determined since a last reset signal. The reset signal may be based upon inserting a new filter into the container assembly 20, therefore the summed values may be used to determine a volume filtered by the filter 66.

In various embodiments, a container assembly 320 may include portions substantially similar to the container 20, discussed above, and also include a flow or volume sensor assembly 330. The container assembly 320 may include a container 324 that has the spout 44. Further, the container 24 may include the handle 40 and the lid assembly 28. The container assembly 320, therefore, may be substantially similar to the container assembly 20, discussed above and include the flow rate and/or volume sensor assembly 330.

Figure 6:
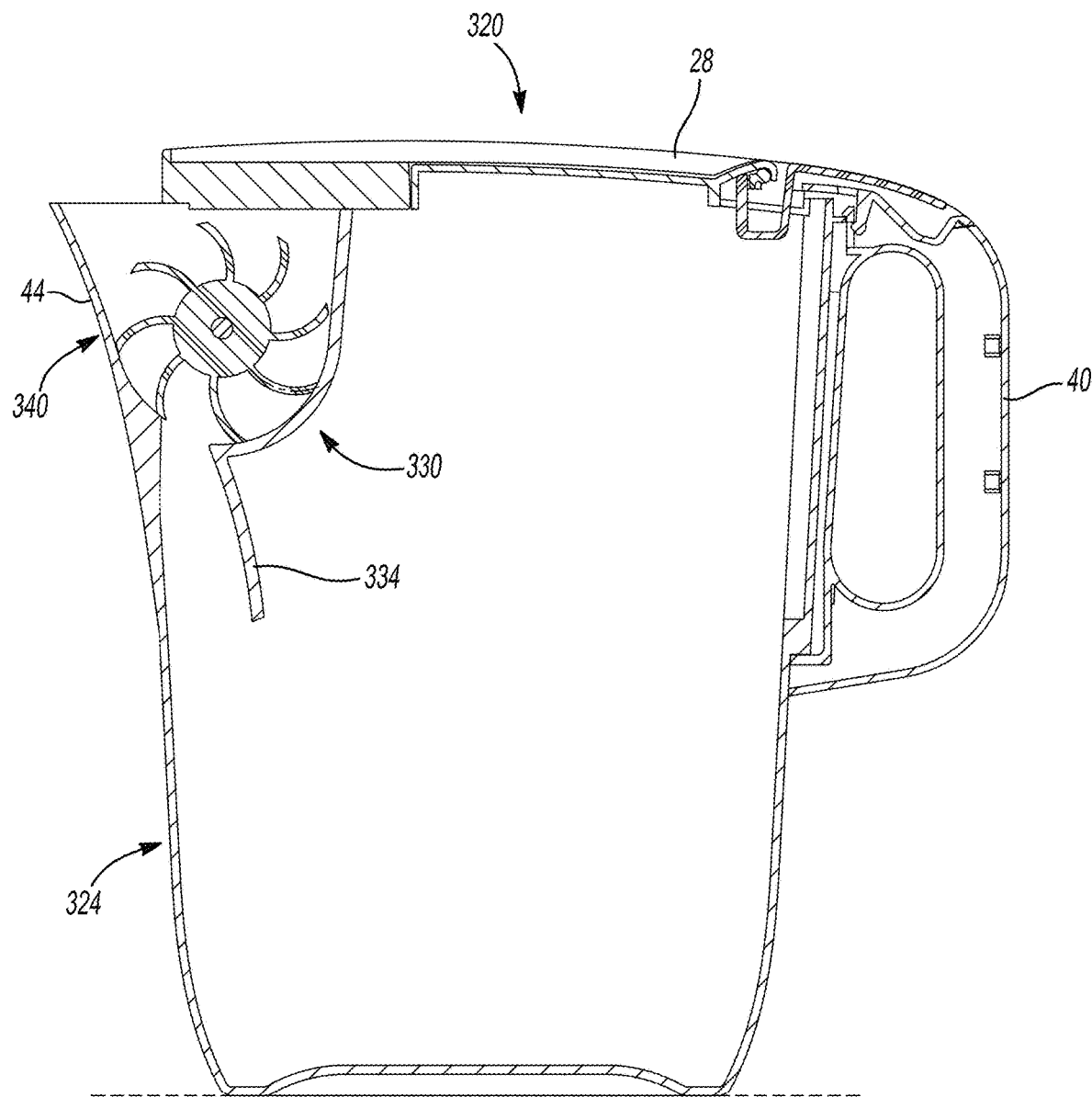
FIG. 6 is a cross-sectional view of a container assembly, according to various embodiments.
Figure 7:
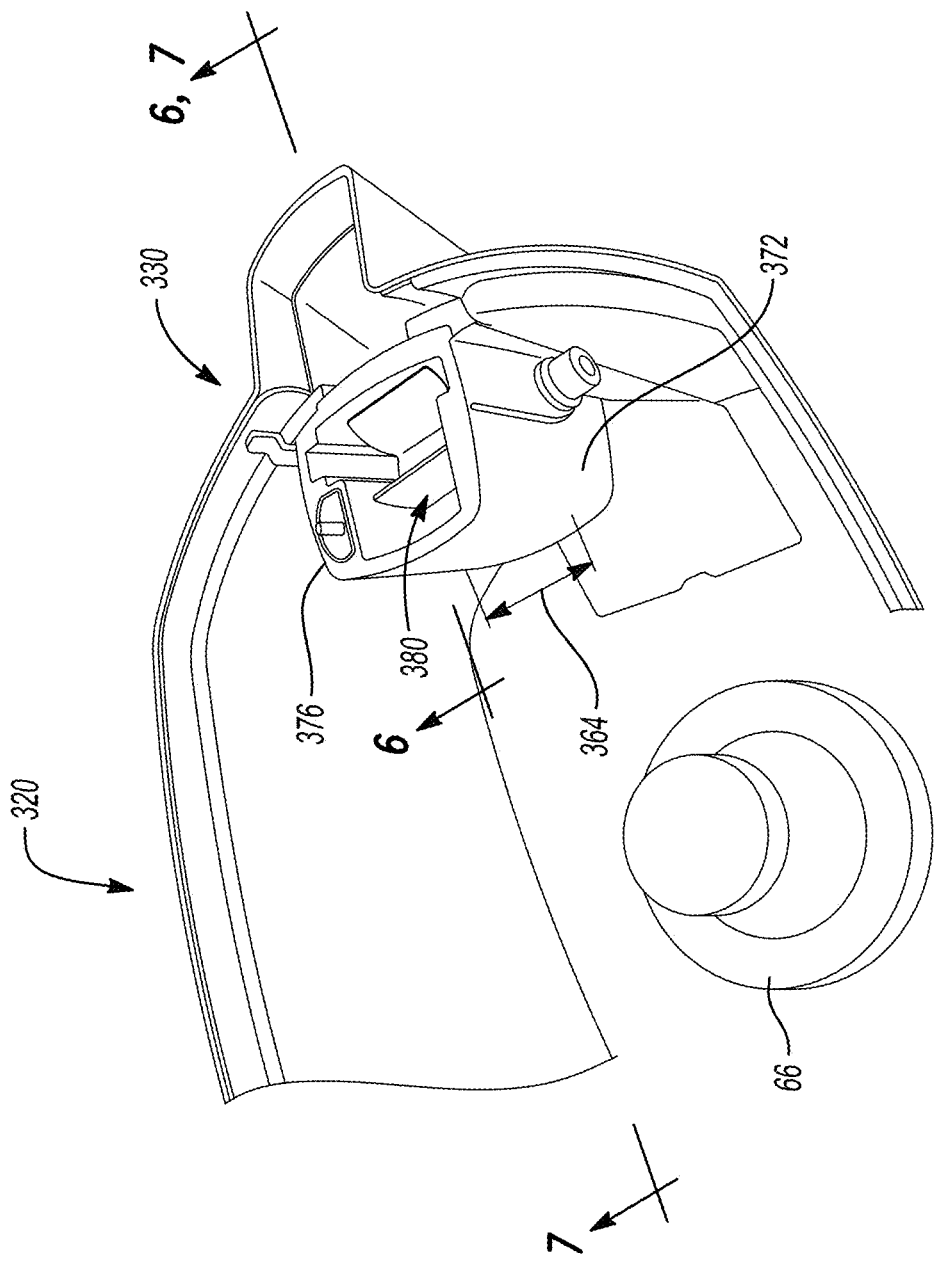
FIG. 7 is a top open view of the container assembly of FIG. 6.

The flow rate sensor assembly 330 may include a channel or directing wall 334 and a flow meter which may also be referred to as a paddle wheel assembly 340. With continuing reference to FIG. 6 and additional reference FIGS. 7, 8 and 9, a flow meter assembly 330 is described in greater detail. The flow meter assembly 330 may include the directing wall 334. The directing wall 334 may direct a flow, such as generally in the direction of arrow 110, between an outer wall 348 of the container assembly 324 and the directing wall 334. As the fluid flows through a channel 350, generally in the direction of arrow 110, the fluid will engage the paddle or wheel assembly 340.

The paddle assembly 340 may include a central hub or portion 354. Extending from the hub 354 may be one or more projections or fingers 358. The fingers 358 may extend along an arc 362 that may have a selected radius to achieve containment or surrounding of a selected volume. The radius may be selected based on the speed of rotation of the central hub 354, length of the fingers, or other appropriate considerations. The hub 354 may include a cylindrical member which may be hollow and have one or more spokes or be solid, as illustrated in FIG. 8. The hub 354 may rotate, such as on axle stubs and/or on an axle 368 that may be formed between two external walls of the flow assembly 330.

The external walls of the sensor assembly 330 may include a first external wall 372 and a second external wall 376. The two external walls 372, 376 may be interconnected by a second or back wall 380. Thus, the sensor assembly 330 may encompass at least a portion of a volume that is completed by a surface 44a of the spout 44. Therefore, a flow of a material generally in the direction of arrow 110 is captured within the flow metering assembly 330 and may be measured and/or metered out of the container assembly 320.

The container assembly 320 may include the filter 66 as discussed above, and the filter rate and/or volume assembly 330 may be used to determine the flow volume and/or rate out of the container assembly 320. Accordingly, the flow rate assembly 330 may be used alone and/or in combination with a sensor assembly 130, as discussed above.

In the flow sensor assembly 330, the projections 358 that extend from the hub 354 may form a volume or define a volume area 381 between adjacent ones of the projections 358, such as a first projection 358a and a second projection 358b. The two projections include internal surfaces and the hub 354 defines a surface to define a volume therein relative to an internal surface 360 of a sensor housing portion 364. The volume 381 may have a defined volume due to the known dimensions of each of the projections 358a, 358b the distance from the hub 354 to the internal surface 360 and a width 364 of the sensor assembly 330. these determined and/or know dimensions allow that each time the rotating wheel assembly 340 rotates past a selected position it may be determined that the selected volume or volume of fluid in the volume 381 has passed or been emptied from the container assembly 320.

The wheel or paddle assembly 340 may include one or more sense portions 390 that may be positioned at various portions, such as within the hub 354 and/or on the hub 354.

The sense portions 390 may be sensed at a sensor or sensing member 394 that may be fixed relative to the housing, such as the external wall 376. The sensor 394 may sense a passage of the sense portion 390. The sensor 394 may interconnect or communicate with a processing module 396 and a memory module 398. The processing module 396 may count the number of times the sense portion 390 passes the sensor 394 and the number of times may be counted and saved in the memory 398. The number of passages may be counted and summed to determine a volume that passes past the flow channel 350 at or over a selected period of time, such as during a pour event. Thus, the wheel or paddle assembly 340 may be used to calculate and determine a volume of a pour from the container assembly 320.

Figure 10:
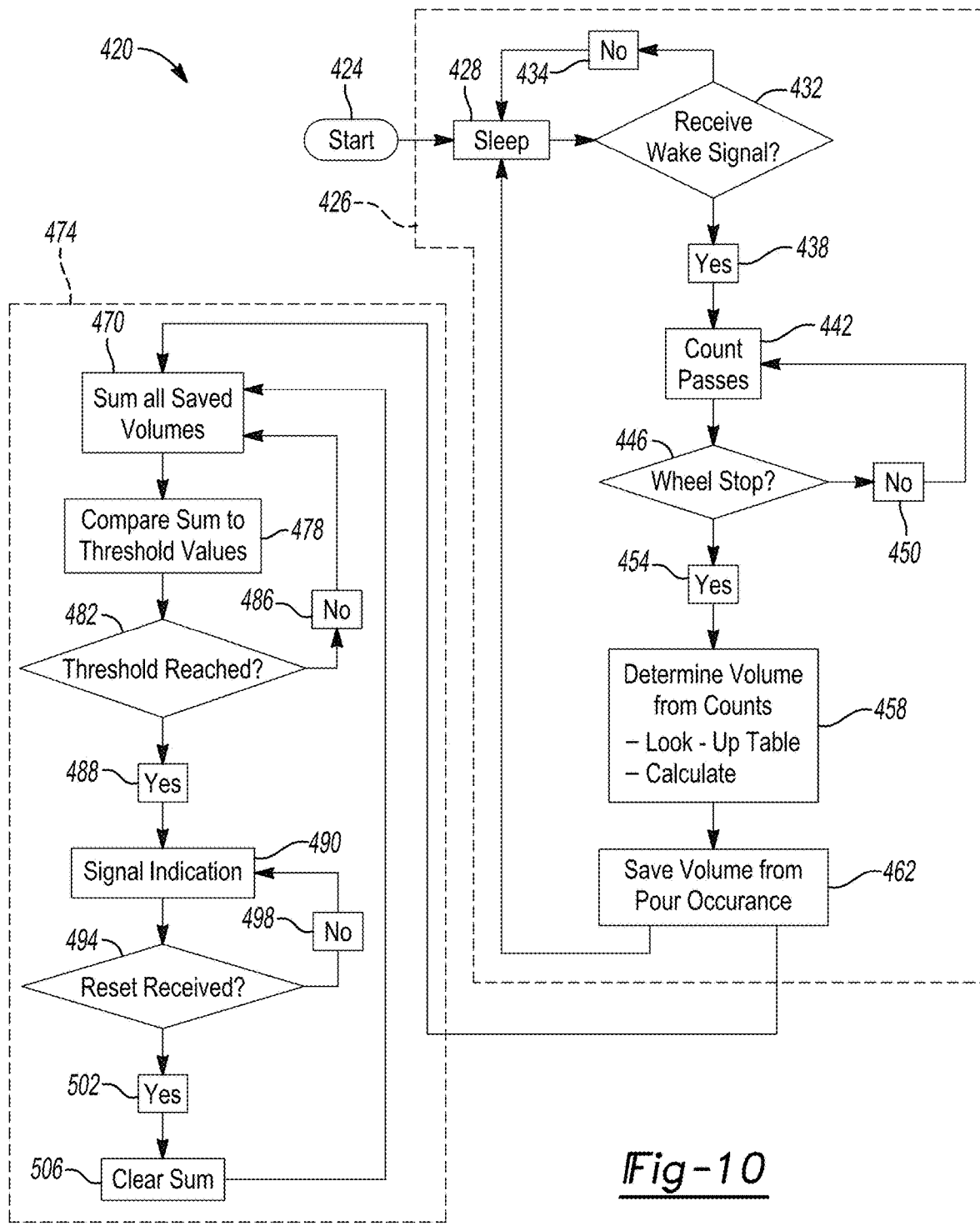
FIG. 10 is a flow chart of a method for determining a volume, according to various embodiments.

With continuing reference to FIGS. 6-9 and additional reference to FIG. 10, a method 420 of determining a volume with the sensor assembly 330 is illustrated. The method 420 may include portions that are similar to the method 190, as discussed above, these portions will not be described in detail below. Reference may be made to the above method and one skilled in the art will understand that the method will incorporate the above noted method portions.

Initially, the process may start in block 424. As discussed above, starting in block 424 may include various steps similar to those discussed in block 194 above. For example, initiation of the system may include a user initiating power from a power source 402. Thereafter the method may enter a sub-process 426 that may include a pour determination and volume determination, similar to the sub-process 262 discussed above. Generally, the method may initialize and move into a sleep mode in block 428 that may include a low power or no power mode. The method may receive a signal or may determine a received signal in block 432. As discussed above, one or more of an accelerometer, tilt switch, or the like may be incorporated with the container assembly 324 to generate a signal when the container assembly 324 moves a selected amount. The signal may be received as a wake signal in block 432. If no wake signal is received, a NO path 434 may be followed to maintain the sleep mode in block 428.

If a wake signal is received in block 432, a YES path 438 may be followed to initiate counting of passes 442. As discussed above, the sensor assembly 330 may include a sensor member 394 that may sense the passage of the sense portions 390 that may include one or more magnets. Accordingly, each time the magnet 390 passes the sensor 394 a count may be made that may be counted and/or stored with the processor module 396 and/or stored in the memory 398. It is understood that other appropriate sensors may be used such as the light sensor, a reed switch, a light beam switch, or the like. In various embodiments, therefore, the magnet 390 may be sensed with the sensor 394 which may be a hall-effect sensor similar to the sensor discussed above. The passes may be counted in block 442 and continue as the wheel rotates. A determination may then be made in block 446 of when the wheel has stopped rotating. If the wheel has not stopped rotating, the pass counts may continue by following a no path 450 to count passes 442.

The counting of passes in block 442 may refer to the number of times that the magnet or switch is activated. A pass count may be less than a full rotation of the wheel. The pass count may refer to the pass or emptying of one portion of the wheel, such as the volume 381. Thus, the volume determination may be based on discrete amounts or portions passes with the wheel and/or a total rotation and volume passed by the wheel.

A wheel stop may be determined in a selected manner, for example no additional counts have been made after a selected period of time (e.g. about 2 seconds, about 5 seconds, about 10 seconds, or an appropriate selected and/or predetermined time). When a wheel stop is determined, a YES path 454 is followed. The YES path 454 may follow to determine a volume from counts in block 458. The determination of the volume from the counts in block 458 may occur by accessing a look-up table in the memory 398 to correlate or determine a volume from a predetermined number of counts. Additionally and/or alternatively, a calculation may be made. For example, a known volume for each count may be known and this may be multiplied by the number of counts. Regardless a determination of volume from the count may be made in block 458.

A volume determined in block 458 may be then stored in the memory module 398 in block 462. The saving of the determined volume in block 462 may relate to a pour occurrence such as between the received wake signal in block 432 and the determination of a wheel stop in block 446. Accordingly, a volume may be saved for each pour occurrence in block 462.

The sub-process 426 may be used to determine a pour volume for each pour occurrence with the container assembly 324. The various pour occurrences may be summed in block 470. The summing and signal indication beginning in block 470 may be similar to the summing and indication discussed above beginning at the sum all saved volumes in block 270. Accordingly, the indication resetting process may be a sub-process 474. The process may be substantially similar to the process discussed above and will be only be discussed briefly here.

After summing saved volumes, a comparison may be made to a threshold volume in block 478. The comparison may be used to determine whether a threshold has been reached in block 482. If the threshold has not been reached, a NO path 486 may be followed to continue summing saved volumes in block 470. If a threshold has been reached or been determined to be reached in block 482, a YES path 488 may be followed to send an indication signal in block 490. Sending the indication signal may be similar to that discussed above in block 290. Thus, the indication signal may be for generating a user signal that may be displayed or otherwise perceptible to the user such as with a color, a user interface display, a sound, haptic feedback, or other appropriate indication.

After the indication signal has been sent or generated in block 490, a determination of whether a reset has been received in block 494 may be made or determined. If no reset signal is received, a NO path 498 may be followed to continue the signal generation in block 490. If a reset signal is received, a YES path 502 may be followed and clearing the sums in block 506 may occur. Clearing the sums in block 506 may be similar to clearing the sums in block 304 discussed above. The sums may be cleared and a new summing of saved volumes may be made in block 470. Thus, the container assembly 324 including the sensor assembly 330 may be used in addition or alternatively to the sensor assembly 130 discussed above.

In various embodiments, therefore, the system may determine an amount of a material that has passed out of the container, such as the container volume 58. The volume that has passed out of the container volume 58 may also be referred to as an exited or passed volume. The passed volume may be based on a determination of a flow meter or system that is used to calculate, such as by summing, a series of smaller volumes over time, according to various embodiments. The disclosed systems, therefore, allow for determining a volume that has exited a container. This may allow for a current and active determination and/or display of a use of a filter system within the container. The filter system may be useful for a selected time and/or volume. The volume passed determination may be used to determine a life of a filter.

Figure 11:
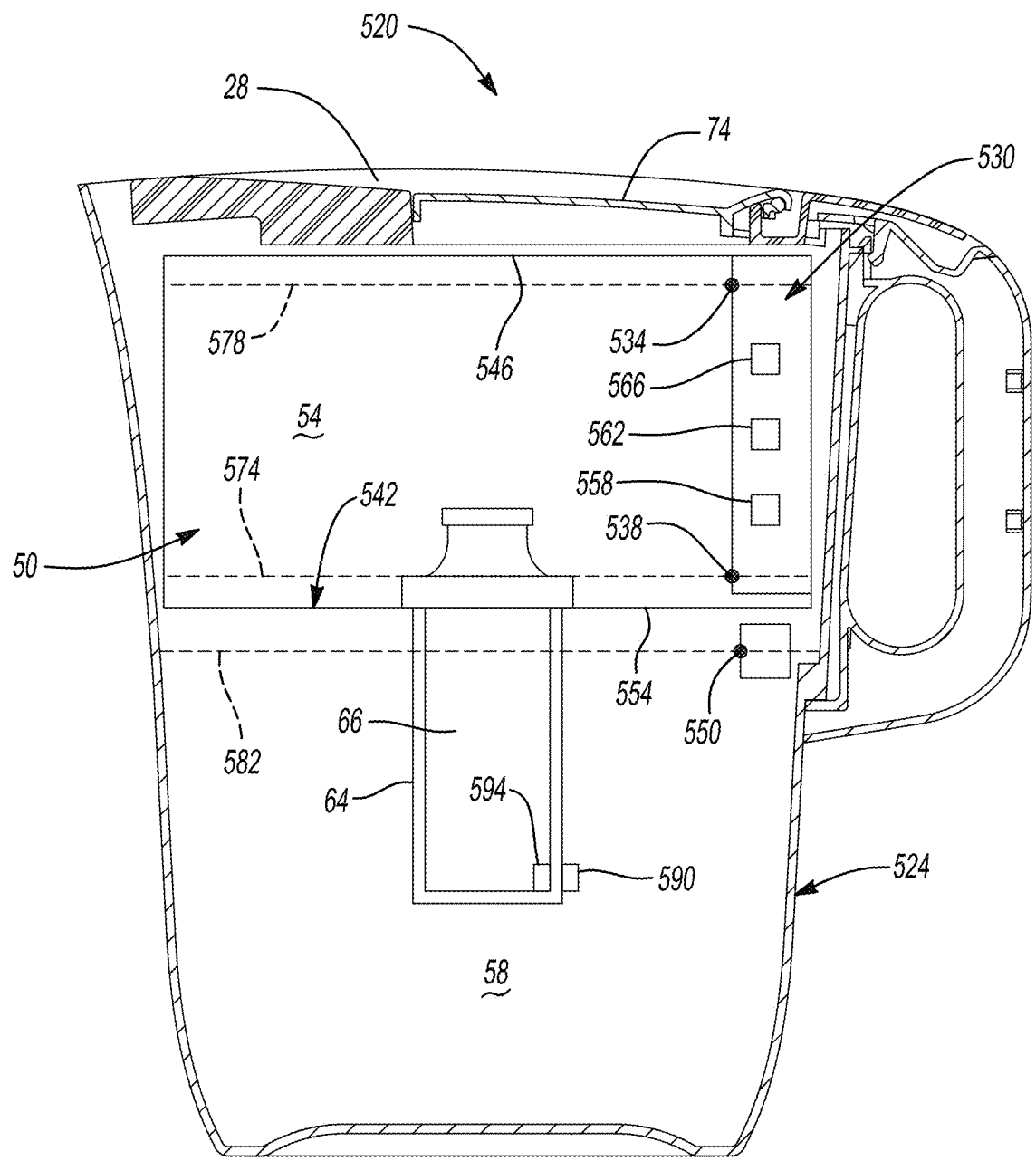
FIG. 11 is a cross-sectional view of a container assembly including a sensor assembly, according to various embodiments.

As discussed above, a flow meter, including the flow meter 130 and the flow meter 330 may be used to measure a flow rate or determine a flow rate out of the perspective container assemblies. The flow rates may be used to determine a volume of fluid that has passed through the respective container assemblies over selected periods of time. In addition and/or alternatively to the sensor assemblies discussed above, a fluid position sensor including a sensor that can sense the presence of a conductive fluid (such as water) may be included. Appropriate, sensors may include those disclosed in U.S. Pat. Nos. 7,905,144; 8,171,802; and U.S. Pat. Pub. No. 2011/0240475, all incorporated herein by reference. The sensors may be positioned within a container assembly, such as the container assembly 20 and/or the container assembly 320 as discussed above. For clarity of the current discussion, a container assembly 520 is illustrated in FIG. 11 that may include a container 524 similar to the container discussed above, such as the container 24. Accordingly, various portions of the container 524 that are similar to those discussed above will not be described in further detail.

The container assembly 520 may include the first volume portion 50 including the filter holding portion 64 that may hold the filter 66. The lid assembly 28 may be removed and/or the open portion 74 may be moved to allow for inlet of a fluid into the container assembly 520, including the container 524. The first volume container 50 may include the volume 54 and a fluid may drain through the filter 66 through the filter holding portion 64 into the second volume 58, thus the container assembly including the container 524 may be filled with fluid that filters through the filter 66. The container assembly 520 may further include a sensor assembly 530. The sensor assembly 530 may include one or more conductive sensors that may sense the presence of a conductive material, such as a conductive fluid including water.

The sensor assembly 530 may include a first sensor portion 534 and a second sensor portion 538 that may be positioned within the initial or first volume 54. The second sensor 538 may sense the presence of a fluid at or near a bottom surface 542 of the first volume 54 and the first sensor 534 may sense presence of a material near a top surface or portion or fill portion 546 of the first volume 54. A third sensor 550 may be positioned within the second volume 58 to sense when a material is near a fill volume, such as near a bottom outer surface 554 of the first volume container 50.

The sensor assembly 530 may further include a processor module 558, a memory module 562, and a power source 566. Each of the sensor portions 534, 538, 550 may be connected to at least the processor module 562 for operation of the sensor assembly 530. As discussed further herein, the various sensor portions 534, 538, 550 may sense the presence of a conductive material and may generate a signal based thereon that may be processed or analyzed by the processor module 562.

Therefore, as fluid enters the container 524, such as through the lid 28 and/or opening the lid 74, fluid may reach a first level 574 within the first volume 54 which may be sensed by the sensor 538. After continued filling, the fluid may reach a second level 578 which may be sensed by the second sensor 534. As fluid enters into the second volume 58 through the filter holding portion 64 fluid may reach a third level 582 within the volume 58 and be sensed by the third sensor 550.

The processing module may be operated to determine a drain rate or filter rate through the filter assembly by counting or determining a time from when the system wakes to sense that water is within the volume 54 and from the time from when the sensor 534 senses water until a time when the sensor 538 does not sense water. The volume change may be known or predetermined and saved in the memory 558 and/or the processor module 562. By determining the time that the predetermined volume, changes the processor module 530 may determine a flow rate of fluid through the filter assembly 66. The flow rate may also be based upon a look up table that includes a time that relates to the known or predetermined volume.

The third sensor 550 may be used to indicate that the first and second sensors 534, 538 may stop sensing as the second volume 58 is filled and cannot receive or would only more slowly receive fluid from the first volume 54. Thus, the third sensor 550 may be used to determine that the second volume 58 is full and that fluid may be removed or drained therefrom.

The flow rate through the filter assembly 66 may be used to confirm an effective dwell time of material within the filter 66, a lifetime use of the filter 66, or other appropriate information. Further, the sensor assembly 530 may be included with one or more of the flow rate sensors discussed above to further indicate or supplement a determination of a lifetime use of the filter 66. For example, the sensor assembly 530 may be used to determine the number of times that the first volume 54 has been filled that would then be filtered by the filter assembly 66. This information may be incorporated and/or included with the other sensor assembly to further determine and/or corroborate a determined filter volume with the other sensor assemblies.

Further, the sensor assembly 530 may operate to determine a total volume that has been filtered through the filter assembly 66 in a manner similar to that discussed above. The sensor assembly 530 may count the number of times that the predetermined volume of water has changed within the volume 54 and sum those to determine a total volume filter. The change in volume and/or the time when water is sensed at least by the second sensor 538 may also be used to assist in determining an amount of time that the filter assembly 660 has filtered water. Therefore, this information also may be incorporated into the methods discussed above to assist in determining a volume of water filtered by the filter member 66.

Further, the container assembly 520 may include a filter sensor portion 590. The filter sensor portion 590 may be any appropriate sensor, such as a radio-frequency identification (RFID) member (e.g., antenna), an RFID reader (e.g., transmitted and/or receiver), or the like. The filter sensor 590 may sense a filter sense portion 594 that may be incorporated into the filter assembly 66. The filter sensor 590 may communicate with one or more of the sensor assemblies, such as the sensor assembly 530, the sensor assembly 130, and/or the sensor assembly 330. The filter sensor 590 may communicate with the sensor assembly to assist in indicating an appropriate filter, such as a volume to be sensed or calculated. Further, the filter sensor 590 may sense the type of filter which may include a volume that may be filtered during a lifetime of the filter 66, a selected time lifetime of the filter, or the like. In addition or alternatively, the filter sensor 590 may provide for an automatic or indicated reset and may be used to generate the signal that may be received to reset the methods, as discussed above, including such as at block 294 and 494 of the respective methods 190 and 420. Therefore, the filter sensor 590 may be used to sense the presence of the filter 66 and generate a signal to reset the previous sums, as discussed above. Without receiving the signal, therefore, the respective sensor assemblies may not reset and allow for a renewed initiation of a volume, as discussed above. The filter 66 may include a portion, such as an RFID antennae, that may be sensed or read by the filter sensor 590 to provide signals to the respective sensor assemblies, as discussed above.

Instructions may be executed by a processor and may include may include software, firmware, and/or microcode, and may refer to programs, routines, functions, classes, data structures, and/or objects. The term shared processor circuit encompasses a single processor circuit that executes some or all code from multiple modules. The term group processor circuit encompasses a processor circuit that, in combination with additional processor circuits, executes some or all code from one or more modules. References to multiple processor circuits encompass multiple processor circuits on discrete dies, multiple processor circuits on a single die, multiple cores of a single processor circuit, multiple threads of a single processor circuit, or a combination of the above. The term shared memory circuit encompasses a single memory circuit that stores some or all code from multiple modules. The term group memory circuit encompasses a memory circuit that, in combination with additional memories, stores some or all code from one or more modules.

The apparatuses and methods described in this application may be partially or fully implemented by a special purpose computer created by configuring a general purpose computer to execute one or more particular functions embodied in computer programs. The computer programs include processor-executable instructions that are stored on at least one non-transitory, tangible computer-readable medium. The computer programs may also include or rely on stored data. The computer programs may include a basic input/output system (BIOS) that interacts with hardware of the special purpose computer, device drivers that interact with particular devices of the special purpose computer, one or more operating systems, user applications, background services and applications, etc.

The computer programs may include: (i) assembly code; (ii) object code generated from source code by a compiler; (iii) source code for execution by an interpreter; (iv) source code for compilation and execution by a just-in-time compiler, (v) descriptive text for parsing, such as HTML (hypertext markup language) or XML (extensible markup language), etc. As examples only, source code may be written in C, C++, C#, Objective-C, Haskell, Go, SQL, Lisp, Java®, ASP, Perl, Javascript®, HTML5, Ada, ASP (active server pages), Perl, Scala, Erlang, Ruby, Flash®, Visual Basic®, Lua, or Python®.

A processor or module or 'controller' may be replaced with the term 'circuit.' The term 'module' may refer to, be part of, or include: an Application Specific Integrated Circuit (ASIC); a digital, analog, or mixed analog/digital discrete circuit; a digital, analog, or mixed analog/digital integrated circuit; a combinational logic circuit; a field programmable gate array (FPGA); a processor circuit (shared, dedicated, or group) that executes code; a memory circuit (shared, dedicated, or group) that stores code executed by the processor circuit; other suitable hardware components that provide the described functionality; or a combination of some or all of the above, such as in a system-on-chip.

Example embodiments are provided so that this disclosure will be thorough, and will fully convey the scope to those who are skilled in the art. Numerous specific details are set forth such as examples of specific components, devices, and methods, to provide a thorough understanding of embodiments of the present disclosure. It will be apparent to those skilled in the art that specific details need not be employed, that example embodiments may be embodied in many different forms and that neither should be construed to limit the scope of the disclosure. In some example embodiments, well-known processes, well-known device structures, and well-known technologies are not described in detail. Further, various embodiments may be combined with others as disclosed herein and as understood by one skilled in the art.

The terminology used herein is for the purpose of describing particular example embodiments only and is not intended to be limiting. As used herein, the singular forms "a," "an," and "the" may be intended to include the plural forms as well, unless the context clearly indicates otherwise. Spatially relative terms, such as "inner," "outer," "beneath," "below," "lower," "above," "upper," and the like, may be used herein for ease of description to describe one element or feature's relationship to another element(s) or feature(s) as illustrated in the figures. Spatially relative terms may be intended to encompass different orientations of the device in use or operation in addition to the orientation depicted in the figures. For example, if the device in the figures is turned over, elements described as "below" or "beneath" other elements or features would then be oriented "above" the other elements or features. Thus, the example term "below" can encompass both an orientation of above and below. The device may be otherwise oriented (rotated 90 degrees or at other orientations) and the spatially relative descriptors used herein interpreted accordingly.

The foregoing description of the embodiments has been provided for purposes of illustration and description. It is not intended to be exhaustive or to limit the disclosure. Individual elements or features of a particular embodiment are generally not limited to that particular embodiment, but, where applicable, are interchangeable and can be used in a selected embodiment, even if not specifically shown or described. The same may also be varied in many ways. Such variations are not to be regarded as a departure from the disclosure, and all such modifications are intended to be included within the scope of the disclosure.

What is claimed is:

1. A system operable to determine a use of a filter in a container, comprising:
  a container extending along an axis and having a pour spout;
  a flow sensor positioned relative to the pour spout and configured to generate a sensor signal;
  an actuating member positioned in the pour spout and moveable relative to the sensor;
  a sense portion coupled to the actuating member and configured to be sensed by the flow sensor, wherein the sensor signal is generated based on sensing the sense portion;
  a position sensor coupled to the container and configured to determine a tilt angle of the container along the container axis;
  a processor module configured to execute instructions to:
    evaluate the sensor signal and the tilt angle;
    determine a flow rate out of the pour spout based upon the sensor signal and the tilt angle;
    determine a state of the filter based at least on the evaluation of the sensor signal; and
    generate an indication signal to provide a user signal to the user via an indicator regarding the determined state of the filter.

2. The system of claim 1, wherein the sensor is a Hall effect sensor and the sense portion is a magnet;
  wherein the sense portion is moved by the actuating member relative to the flow sensor.

3. The system of claim 1, wherein the instructions include a correlation of a sensed position of the actuating member to a flow rate.

4. The system of claim 3, wherein the correlation includes a voltage generated in the flow sensor to the flow rate.

5. The system of claim 3, wherein the actuating member is operable to obstruct a flow path and open a flow path a selected amount;
  wherein the correlation includes five positions of the actuating member relative to a flow path, 0% open, 25% open, 50% open, 75% open, and 100% percent open.

6. The system of claim 5, wherein the processor module is configured to execute further instructions to:
  determine a pour event;
  determine a time at each of the five positions during the pour event;
  calculate a volume poured at each position based on the determined time and the correlated flow rate; and
  determine a pour volume for the determined pour event at least by summing the calculated volume poured at each position.

7. The system of claim 6, wherein the determined time is zero at any of the five positions.

8. The system of claim 1, further comprising:
  a biasing member configured to bias the actuating member into an obstructing position;
  wherein the actuating member is operable to obstruct a flow path in the obstructing position and open a flow path a selected amount when moved from the obstructing position.

9. The system of claim 1, wherein the actuating member is operable to obstruct a flow path and open a flow path a selected amount;
  wherein the actuating member moves to open the flow path due only to a force applied by a fluid against the actuating member.

10. The system of claim 1, further comprising:
  an indicator assembly configured to receive the indication signal and provide the user signal to the user;
  wherein the user signal includes a user perceptible signal based on the sensor signal.

11. The system of claim 1, further comprising:
  a light emitting portion, wherein the user signal is light emitted by the light emitting portion.

12. The system of claim 1, further comprising:
  wherein the position sensor is configured to wake up to the processor module.

13. The system of claim 1, further comprising:
  a sensor assembly configured to be positioned in a first reservoir of the container;
  wherein the sensor assembly includes a first sensor portion and a second sensor portion;
  wherein each of the first sensor portion and the second sensor portion are operable to sense presence of a conductive liquid;
  wherein a processor module is configured to execute further instructions to combine the flow sensor signal and a sensor signal from at least one of the first sensor portion and the second sensor portion to determine the state of the filter.

14. A method of determining a use of a filter in a container, comprising:
generating a sensor signal from a flow sensor based on a movement of a sense portion connected to an actuating member relative to the sensor, wherein the sensor signal is generated based on sensing the sense portion upon movement of the actuating member within a pour spout of the container;
executing instructions with a processor module to:
evaluate the sensor signal;
determine a tilt angle of the container;
determine a flow rate out of the pour spout based upon the sensor signal and the tilt angle;
determine a state of the filter based at least on the evaluation of the sensor signal, and
generate an indication signal to provide a user signal to the user via an indicator regarding the determined state of the filter.

15. The method of claim 14, wherein the flow sensor is a magnetic field sensor and the sense portion is a magnet;
wherein the sensor signal is a voltage that is proportional to the strength of the magnetic field sensed by the flow sensor.

16. The method of claim 14, further comprising:
biasing the actuating member into an obstructing position within the pour spout;
wherein the actuating member is operable to obstruct a flow path in the obstructing position and open a flow path a selected amount when moved from the obstructing position.

17. The method of claim 14, further comprising:
providing the actuating member to move at least between obstructing a flow path and opening a flow path through the pour spout;
wherein providing the actuating member to move to opening the flow path includes allowing the actuating member to move due only to a force applied by a fluid against the actuating member.

18. The method of claim 14, further comprising executing instructions with the processor module to determine that the actuating member is in at least one of five positions based in the sensor signal;
wherein the five positions of the actuating member relative to a flow path include 0% open, 25% open, 50% open, 75% open, and 100% percent open.

19. The method of claim 18, further comprising executing instructions with the processor module to:
determine a pour event;
determine a time at each of the five positions during the pour event;
calculate a volume poured at each position based on the determined time and the correlated flow rate; and
determine a pour volume for the determined pour event at least by summing the calculated volume poured at each position.

20. The method of claim 14, further comprising:
displaying the user signal to the user based on the generated indication signal;
wherein the user signal includes a user perceptible signal based on the sensor signal.

21. A system operable to determine a use of a filter in a container, comprising:
a container extending along a 1 axis a pour spout;
a flow meter assembly configured to be positioned near an outlet, including:
a flow sensor configured to generate a sensor signal,
a rotating member configured to rotate about an axis relative to the flow sensor,
a sense portion fixed to the rotating member and configured to be sensed by the flow sensor as the rotating member rotates relative to the flow sensor, wherein the sensor signal is generated based on sensing the sense portion;
a position sensor coupled to the container and configured to determine a tilt angle of the container along the container axis;
a processor module configured to execute instructions to:
evaluate the sensor signal and the tilt angle;
determine a flow volume that has passed through the outlet based upon the sensor signal and the tilt angle;
determine a state of the filter based at least on the evaluation of the sensor signal, and
generate an indication signal to provide a user signal to the user via an indicator regarding the determined state of the filter.

22. The system of claim 21, wherein the rotating member includes a hub and a plurality of radially extending members;
wherein each of the radially extending members extend from the hub to a wall of the flow meter assembly;
wherein a volume is defined between each adjacent pair of the radially extending members, the hub, and the wall.

23. The system of claim 22, wherein the evaluation of the sensor signal includes determining a number of times the volume has been emptied from the outlet and determining a total volume emptied from the container by multiplying the determined number of times the volume has been emptied from the outlet and the volume.

24. The system of claim 21, further comprising:
a sensor assembly configured to be positioned in a first reservoir of the container;
wherein the sensor assembly includes a first sensor portion and a second sensor portion;
wherein each of the first sensor portion and the second sensor portion are operable to sense presence of a conductive liquid;
wherein a processor module is configured to execute further instructions to combine the flow sensor signal and a sensor signal from at least one of the first sensor portion and the second sensor portion to determine the state of the filter.

* * * * *